United States Patent
Paek et al.

(10) Patent No.: US 9,240,573 B2
(45) Date of Patent: Jan. 19, 2016

(54) METHOD OF FABRICATING ORGANIC ELECTROLUMINESCENT DEVICE

(71) Applicant: LG DISPLAY CO., LTD., Seoul (KR)

(72) Inventors: Seung-Han Paek, Bucheon-si (KR); Young-Mu Oh, Seoul (KR); Jeong-Won Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 73 days.

(21) Appl. No.: 14/066,292

(22) Filed: Oct. 29, 2013

(65) Prior Publication Data

US 2014/0120645 A1    May 1, 2014

(30) Foreign Application Priority Data

Oct. 31, 2012  (KR) .......................... 10-2012-0122676

(51) Int. Cl.
| | |
|---|---|
| H01L 27/32 | (2006.01) |
| H01L 51/56 | (2006.01) |
| H01L 21/02 | (2006.01) |

(52) U.S. Cl.
CPC .......... *H01L 51/56* (2013.01); *H01L 21/02118* (2013.01); *H01L 27/3204* (2013.01); *H01L 27/3211* (2013.01); *H01L 27/3295* (2013.01); *H01L 2227/323* (2013.01)

(58) Field of Classification Search
CPC .................... H01L 21/02109; H01L 21/02296
See application file for complete search history.

(56) References Cited

FOREIGN PATENT DOCUMENTS

KR      1020120119089 A     10/2012

OTHER PUBLICATIONS

Kajiyama, Yoshitaka et al. "Vacuum Deposition of OLEDs with Feature Size ≤ 20um Using a Contact Shadow Mask Patterned In-situ by Laser Ablation" SID Digest 2012: 1544-1547.
Office Action issued in corresponding Korean Patent Application No. 10-2012-0122676, mailed Jan. 9, 2014, 3 pages.

*Primary Examiner* — Cheung Lee

(74) *Attorney, Agent, or Firm* — Brinks Gilson & Lione

(57) ABSTRACT

A method of fabricating an organic electroluminescent display includes: forming a plastic layer on a substrate including a first pixel region; patterning the first plastic layer to form a first opening in the first pixel region; forming a first organic light emitting layer on the first plastic layer having the first opening; and removing the first plastic layer from the substrate to form a first organic light emitting pattern in the first opening.

9 Claims, 14 Drawing Sheets

METHOD OF FABRICATING ORGANIC ELECTROLUMINESCENT DEVICE

The present application claims the priority benefit of priority to Korean Patent Application No. 10-2012-0122676 filed in Republic of Korea on Oct. 31, 2012, which are hereby incorporated by reference in its entirety.

BACKGROUND

1. Field of the Disclosure

The present disclosure relates to an organic electroluminescent device.

2. Discussion of the Related Art

An organic electroluminescent device is one of flat panel displays and has advantages of high luminance and low driving voltage. Further, since it is self-luminescent type, it has high contrast ratio, thin profile, no limit to viewing angle, stability at low temperature, easy displaying images due to response speed of about several microseconds, and simple fabrication and design of driving circuit due to low driving voltage of DC 5V to 15V.

Accordingly, the organic electroluminescent device is used various IT devices such as TV, monitor and cell phones.

The organic electroluminescent device includes an array device and an organic light emitting diode. The array device includes a switching thin film transistor connected to a gate line and a data line, and a driving thin film transistor connected to the organic light emitting diode. The organic light emitting diode includes a first electrode connected to the driving thin film transistor, an organic light emitting layer and a second electrode.

A light emitted from the organic light emitting diode travels toward the first electrode or the second electrode to display images. In light of aperture ratio, a top emission type of organic electroluminescent device is used that emits light toward the second electrode.

The organic light emitting layer of the organic electroluminescent device as above is formed with a thermal deposition method that uses a shadow mask made of metal material.

FIG. 1 is a schematic view illustrating a thermal deposition method using a shadow mask according to the related art.

An organic light emitting material 51 in powder form is located in a deposition device 50 having a heating means. In a chamber in a vacuum, when the heating means is operated and heat the deposition device 50, the heat is transferred to the organic light emitting material 51 and the organic light emitting material 51 is sublimated. The organic light emitting material gas 52 is emitted through an outlet of the deposition device 50, and is selectively deposited on the substrate 70 through a shadow mask 30 having opening portions OA1 and OA2 over the outlet of the deposition device 50 to form an organic light emitting layer on a substrate 70

Regarding fabrication of the shadow mask 30, a metal plate are patterned at both of a top surface and a bottom surface in a mask process, for example, including deposition of photoresist, light exposure, developing and etching to form the opening portions OA1 and OA2, and a shielding portion SA located between the adjacent opening portions OA1 and OA2. The opening portion OA1 at the top surface area has an area different from that of the opening portion OA2 at the bottom surface.

The patterning process to form the shadow mask 30 is relevant to an etching rate of the metal material of the shadow mask 30 and a thickness t of the shadow mask 30. In case of etching the shadow mask 30 in one direction, size difference of each of the opening portions OA1 and OA2 occurs much, and error due to area difference between the opening portions OA1 and OA2 for each location occurs much. To prevent this, the simultaneous etching for the top surface and the bottom surface are performed.

Accordingly, the area of the opening portions OA1 and OA2, and in more detail, the width (that is a width of the opening portion at the surface facing the substrate 70) is required to be at least 32 um in order that the width is in the error range permissible in fabrication.

In case that the width A of the opening portion facing the substrate 70 is less than 32 urn, the opening portion OA2 at the bottom surface of the shadow mask 30 has a greater area if the thickness t of the shadow mask 30 is constant (e.g., t=40 um). In this case, a portion between the adjacent opening portions OA2 i.e., a width of a rib portion is very small, and this causes reduction of hardness of the shadow mask 30, and thus when the shadow mask 30 sags, shape deformation of the opening portions occurs.

The reduction of the thickness t of the shadow mask can solve this problem. However, the thickness of the shadow mask made of metal material is usually limited to 40 um, and a metal plate less than 40 um is not produced and thus fabricating the shadow mask having such the thickness is impossible. Even though such the thickness is allowed, a bearing power between the opening portions OA1 and OA2 become less and thus sagging becomes more.

Moreover, when the organic light emitting material is thermally deposited on the substrate 70 using the shadow mask 30, the material is spread in deposition process due to shadow effect and etc. In other words, the organic light emitting pattern is formed beyond the opening portions of the shadow mask. Further, location change of the shadow mask 30 and pitch change of the opening portions OA1 and OA2 of the shadow mask 30 occurs in deposition process. Considering such the various factors, a bank (not shown), which is formed at a boundary portion between adjacent pixel regions, is required to have a width of at least 12 um. However, forming the bank having at least 12 um causes increase of the boundary portion, and thus there is a limit to a resolution of the display device.

Moreover, when forming large-sized display device having 10 inch or more, the area of the shadow mask 30 is required to be increased, and in this case, the shadow mask, particularly a center portion thereof sags much due to increase of weight, and formation error of the organic light emitting layer occurs much.

Accordingly, fabricating the organic electroluminescent display having the large size of at least 10 inch and having high resolution of at least 250 PPI (pixels per inch) using the shadow mask 30 is difficult.

SUMMARY

A method of fabricating an organic electroluminescent display includes: forming a plastic layer on a substrate including a first pixel region; patterning the first plastic layer to form a first opening in the first pixel region; forming a first organic light emitting layer on the first plastic layer having the first opening; and removing the first plastic layer from the substrate to form a first organic light emitting pattern in the first opening.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EXEMPLARY EMBODIMENTS

Reference will now be made in detail to exemplary embodiments, examples of which are illustrated in the accompanying drawings.

Figure 1:
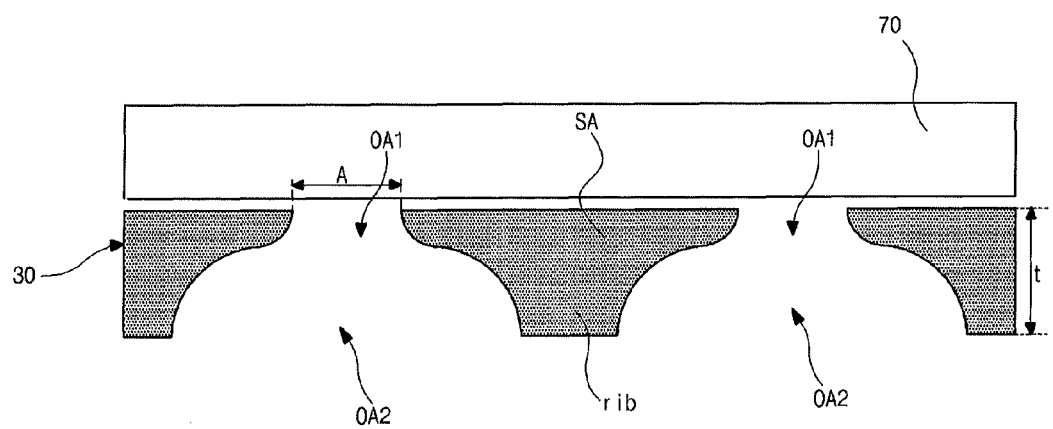
FIG. 1 is a schematic view illustrating a thermal deposition method using a shadow mask according to the related art.
Figure 1:
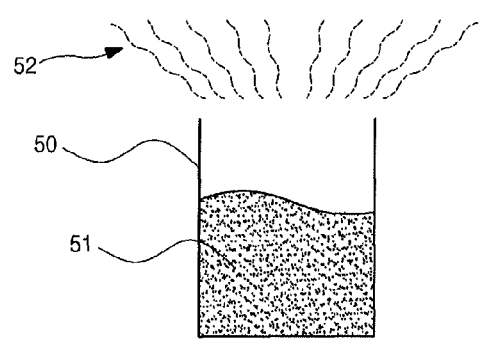
Figure 2A:
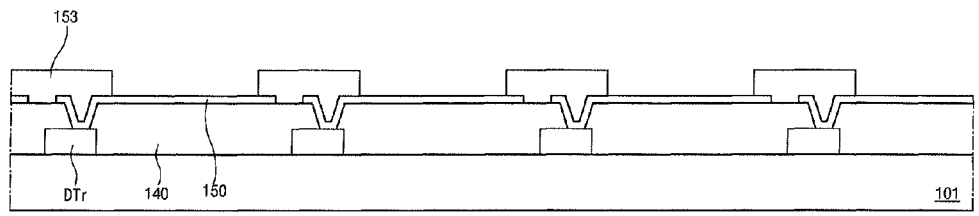
FIGS. 2A to 2R are cross-sectional views illustrating a method of fabricating an organic electroluminescent display according to a first embodiment of the present invention.
Figure 2B:
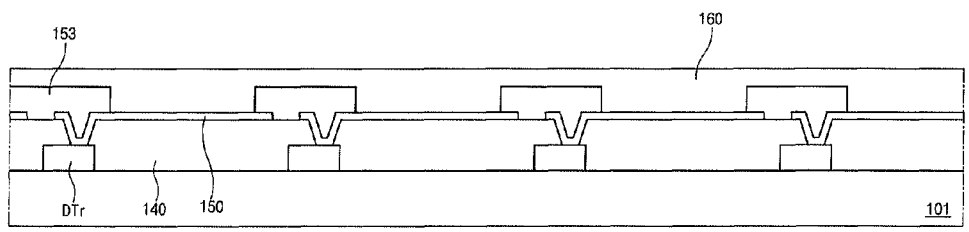
Figure 2C:
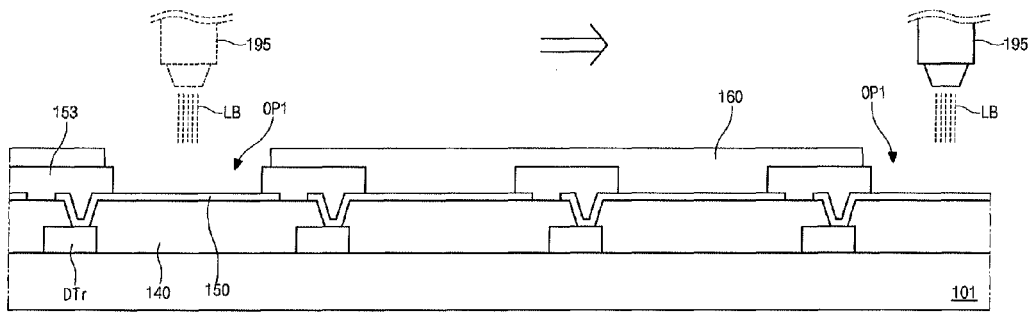
Figure 2D:
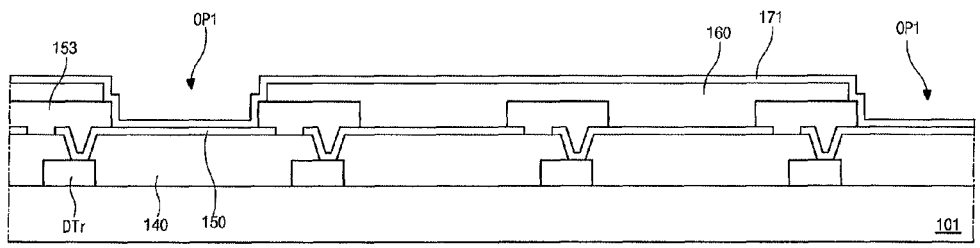
Figure 2E:
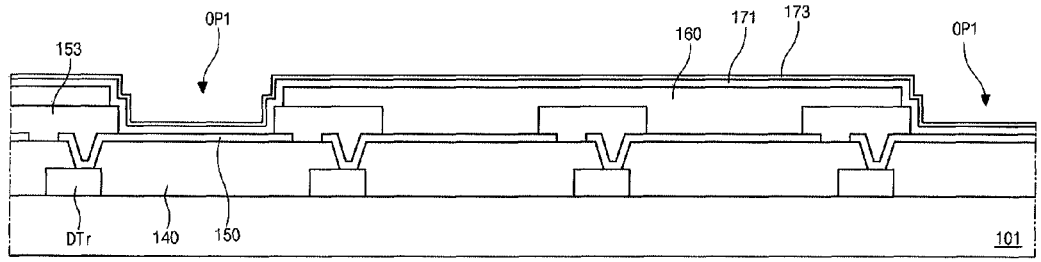
Figure 2F:
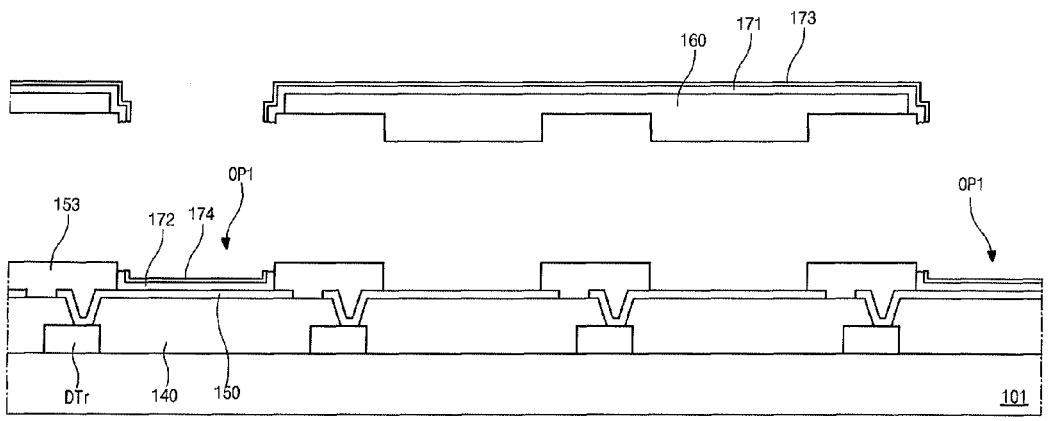
Figure 2G:
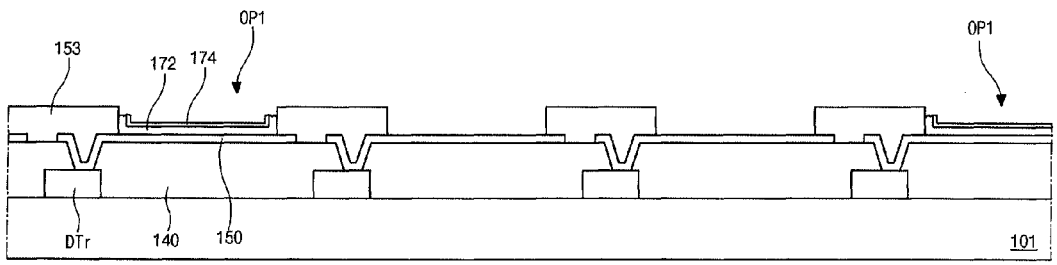
Figure 2H:
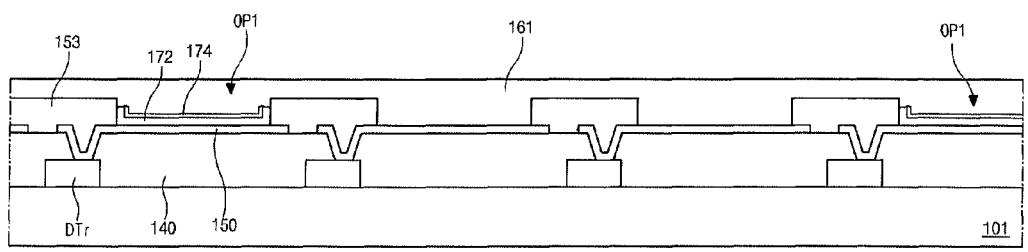
Figure 2I:
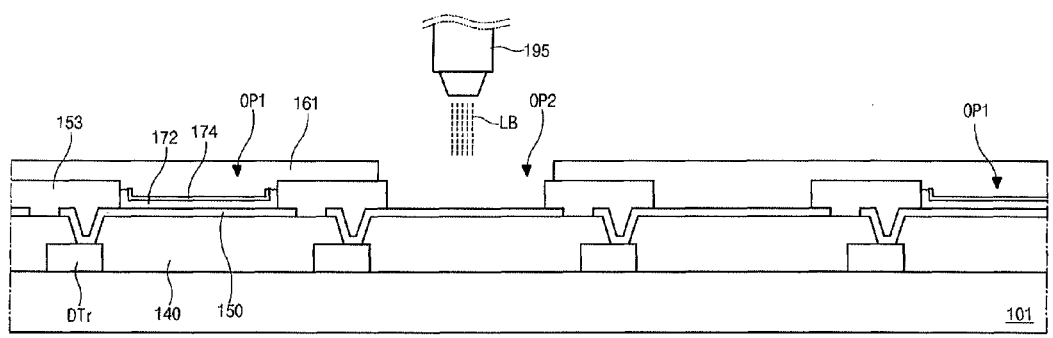
Figure 2J:
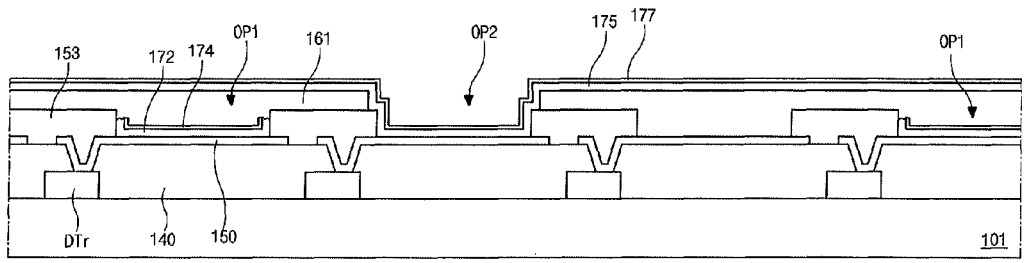
Figure 2K:
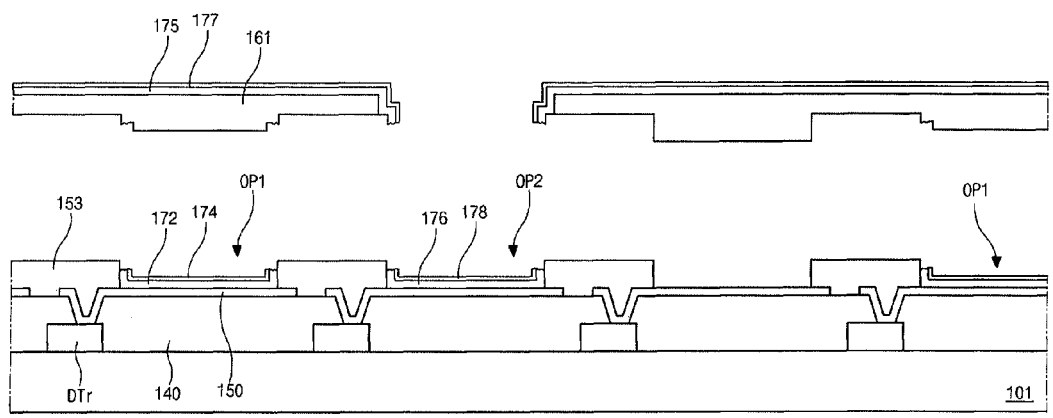
Figure 2L:
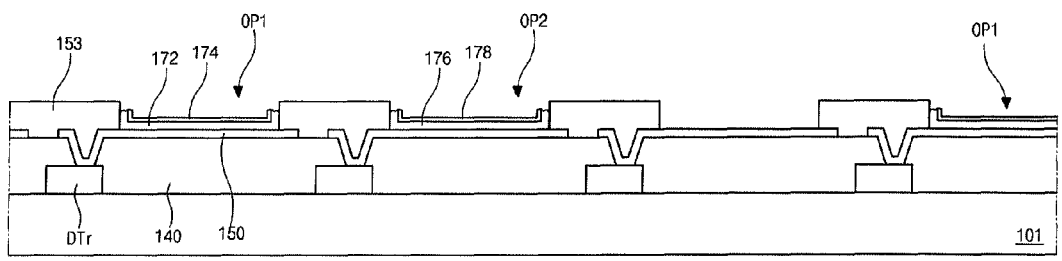
Figure 2M:
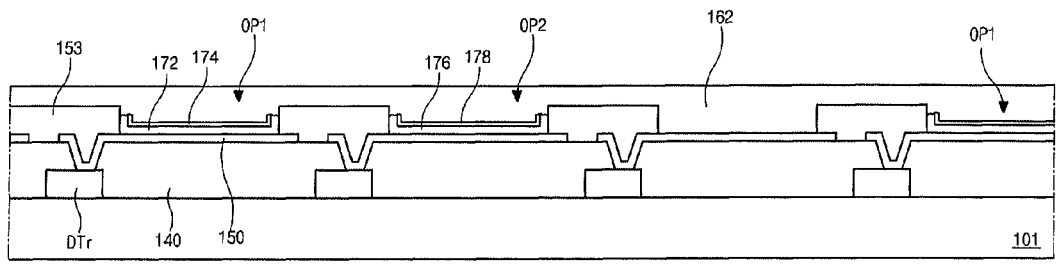
Figure 2N:
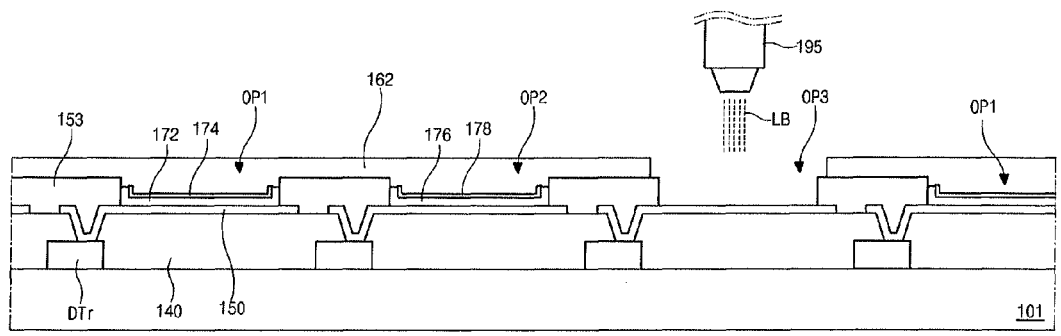
Figure 2O:
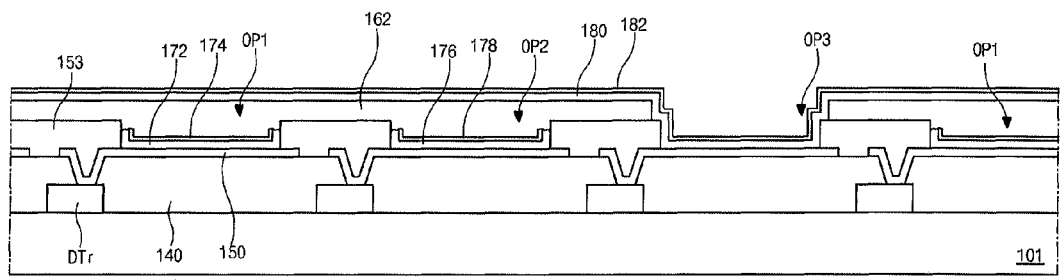
Figure 2P:
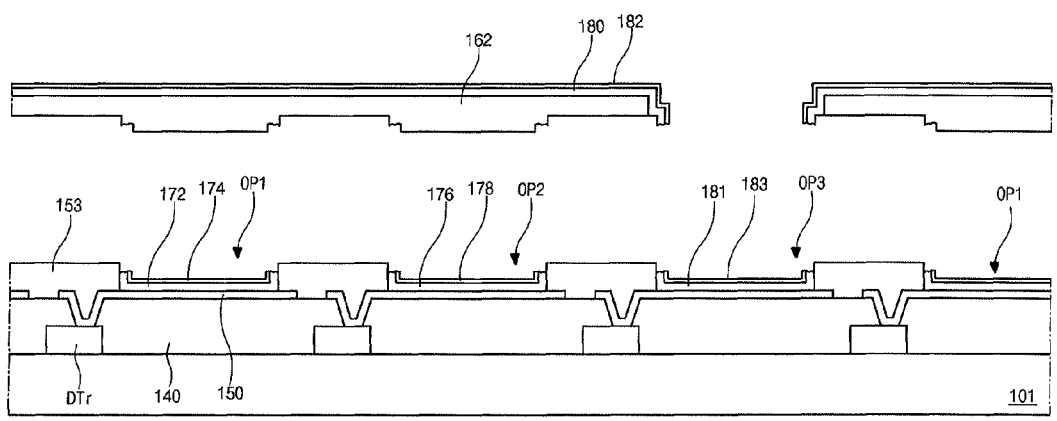
Figure 2Q:
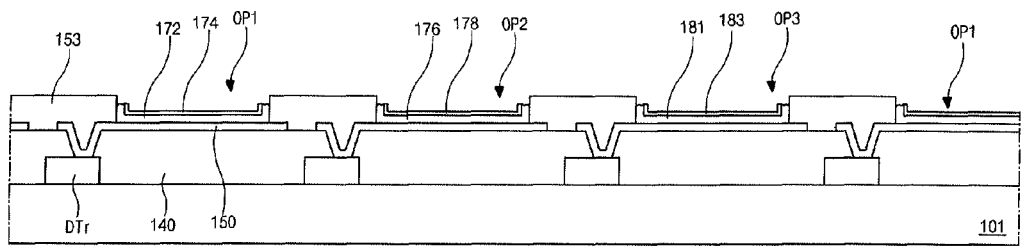
Figure 2R:
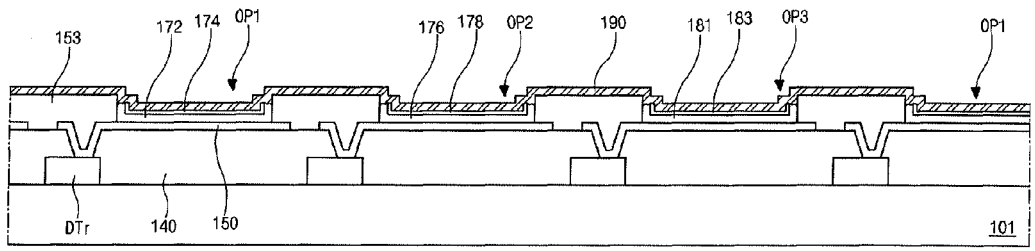

FIGS. 2A to 2R are cross-sectional views illustrating a method of fabricating an organic electroluminescent display according to a first embodiment of the present invention. For the purposes of explanation, processes before forming an organic light emitting layer are omitted.

Referring to FIGS. 2A and 2B, a plastic material in liquid state is coated on a substrate 101 that has a driving thin film transistor DTr, a first electrode 150 and a bank 153. Although not shown in the drawings, a switching thin film transistor may be formed in the processes of forming the driving thin film transistor DTr. The first electrode 150 is formed in each pixel region, and the bank 153 is formed at a boundary portion between the adjacent pixel regions.

Coating the plastic material may be formed with a bar coating apparatus, slit coating apparatus, or spin coating apparatus. The coated plastic material is thermal-treated and hardened to form a first plastic layer 160 having a substantially flat surface. As the thickness of the first plastic layer 160 is less, fine pattern is formed better. However, in case that the first plastic layer 160 is very thin, the first plastic layer 160 may be torn in a post-process of detaching or stripping it. Accordingly, it is preferred that the first plastic layer 160 has a thickness of about 1 um to about 100 um.

The plastic material in liquid state may include at least one of PET (polyethylene terephthalate), TAC (triacetylcellulose), PC (polycarbonate), PMMA (polymethylmethacrylate), PES (polyether sulfone), PI(polyimide), COC (cyclic olefin copolymer) and acrylic group material.

The plastic layer 160 may be formed in another method. For example, a film-type plastic material is laminated on the substrate 101.

Then, referring to FIG. 2C, a laser beam LB having a predetermined energy density is radiated by a laser apparatus 195 for a portion of the first plastic layer 160, at where an organic light emitting layer emitting a red light is formed, to selectively burn and remove the first plastic layer 160.

Accordingly, a first opening OP1 is formed at the region where the laser beam LB is radiated.

The first opening OP1 may be formed in another method. For example, a patterning method is used through a mask process that includes deposition of photoresist, light exposure using photo mask, developing the photoresist to form a photoresist pattern, etching the plastic layer 160 using the photoresist pattern to form the first opening OP1, and stripping the photoresist pattern.

In this method, when the first plastic layer 160 has a photosensitivity by mixing at least one of PET (polyethylene terephthalate), TAC (triacetylcellulose), PC (polycarbonate), PMMA (polymethylmethacrylate), PES (polyether sulfone), PI(polyimide), COC (cyclic olefin copolymer) and acrylic group material and a photosensitive material, the photoresist layer is not used, and the mask process is performed for the photosensitive first plastic layer 160 to form the first opening OP1.

Then, referring to FIG. 2D, a red organic light emitting material is deposited entirely on the first plastic layer 160 having the first opening OP1, without a shadow mask, to form a red organic light emitting layer 171. For example, the organic light emitting material may be formed in a vacuum using a thermal deposition method.

Then, referring to FIG. 2E, a first auxiliary layer 173 may be formed entirely on the red organic light emitting layer 171. The first auxiliary layer 173 is used to protect the red organic light emitting layer 171 and prevent permeation of moisture or oxygen. The first auxiliary layer 173 may be made of an inorganic insulating material, for example, silicon oxide ($SiO_2$) or silicon nitride (SiNx), or an organic insulating material.

The first auxiliary layer 173 may not be employed in the device.

Then, referring to FIGS. 2F and 2G, the first plastic layer 160 is released from or de-laminated from the substrate 101 and thus removed from the substrate 101. Accordingly, the red organic light emitting layer 171 and the first auxiliary layer 173 on the first plastic layer 160 are also removed while the red organic light emitting layer 171 and the first auxiliary layer 173 in the first opening OP 1 remains.

To release the first plastic layer 160 from the substrate 101, a laser beam may be radiated from the back of the substrate 101 to the first plastic layer 160. In this case, the laser beam may have an energy density that is less than that to form an opening in the first plastic layer 160, and makes phase change at an interface between the first plastic layer 160 and the first electrode 150 or the bank 153. This method may be referred to as a laser release.

Alternatively, de-lamination method may be employed. In this case, a jig or the like, which can adhere to a vertex or corner of the substrate 101, adheres to an end of the first plastic layer 160 to fix the first plastic layer 160 to the jig. Then, in the state that the first plastic layer 160 is fixed to the jig, a force is applied in a direction to the jig to de-laminate the first plastic layer 160 from the substrate 101.

To remove the first plastic layer 160 better, a surface treatment for the bank 153 and the first electrode 150 may be performed before forming the first plastic layer 160. For example, a hydrogen plasma treatment, oxygen plasma treatment, ashing process, or thin film surface coating process (e.g., exposing the substrate to fluorine) is performed to reduce an adhesion force between the first plastic layer 160 and the substrate 101.

By removing the first plastic layer 160 from the substrate 101, the red organic light emitting pattern 172 and the first auxiliary pattern 174 thereon are formed in the opening OP 1 on the substrate 101. The first electrode 150 and the bank 153 are exposed at regions other than the first opening OP1.

Then, referring to FIG. 2H, a plastic material is coated on the substrate 101 having the red organic light emitting pattern 172 and thermally treated for hardening, or film-laminated to form a second plastic layer 161.

A surface treatment for reduction of adhesion force may be performed before forming the second plastic layer 161.

Then, referring to FIG. 2I, radiation of a laser beam LB or a mask process is performed for the second plastic layer 161. Accordingly, a second opening OP2 is formed at a location where a corresponding organic light emitting pattern emitting green light is formed. The processes of the laser beam radiation or the mask process for the second opening OP2 are similar to those of the first openings and thus are omitted.

Then, referring to FIG. 2J, the green organic light emitting layer 175 is formed entirely on the substrate 101 having the second opening OP2. A second auxiliary layer 177 may be formed on the green organic light emitting layer 175.

Then, referring to FIG. 2K, the laser release method or de-lamination method is performed to remove the second plastic layer 161 is removed from the substrate 101 to form the green organic light emitting pattern 176 and the second auxiliary pattern 178 thereon in the second opening OP2.

Then, referring to FIGS. 2L to 2Q, processes similar to those to form the red organic light emitting pattern 172 and the first auxiliary pattern 174 or the green organic light emitting pattern 176 and the second auxiliary pattern 178 are performed to form a blue organic light emitting pattern 181 and a third auxiliary pattern 183 thereon in a third opening OP3.

Then, referring to FIG. 2R, a second pixel electrode 190 is formed on an entire display region of the substrate 101 having the first to third auxiliary patterns 174, 178 and 183. Accordingly, an array substrate for an organic electroluminescent display is fabricated.

Although not shown in the drawings, the array substrate and an opposing substrate facing the array substrate are attached in a vacuum to each other using a seal pattern formed at a peripheral portion of at least one of the array substrate and the opposing substrate, or using a face seal therebetween to form the organic electroluminescent display. Alternatively, the array substrate is attached to a film using a face seal therebetween to form the organic electroluminescent display.

In the above embodiment, the red, green and blue organic light emitting patterns 172, 176 and 181 are formed in the first to third openings OP1 to OP3, respectively. However, the openings OP1 to OP3 corresponding to the red, green and blue organic light emitting patterns 172, 176 and 181 may be changed.

As described above, the plastic layers 160 to 162 are formed without the related art shadow mask and is patterned in the laser radiation or the mask process having high precision in patterning to form the first to third openings OP1 to OP3, and the red, green and blue organic light emitting layers are formed corresponding to the first to third openings OP1 to OP3, and the plastic layers 160 to 162 are removed to form the red, green and blue organic light patterns 172, 176 and 181.

Accordingly, the red, green and blue organic light emitting patterns 172, 176 and 181 can be formed at more correct locations by precise control. Therefore, the color spread due to shadow effect and the pattern error of organic light emitting patterns sagging of the shadow mask in the related art can be prevented, and the organic electroluminescent display having a high resolution of 250 PPI or more can be fabricated.

Moreover, since the location error of the organic light emitting patterns is reduced, and the width of the bank 153 at the boundary portion of the pixel region can be reduced. Therefore, aperture ratio can increase.

FIGS. 3A to 3L are cross-sectional views illustrating a method of fabricating an organic electroluminescent display according to a second embodiment of the present invention. For the purposes of explanation, processes before forming an organic light emitting layer are omitted, and parts similar to those of the first embodiment may be omitted.

Figure 3A:
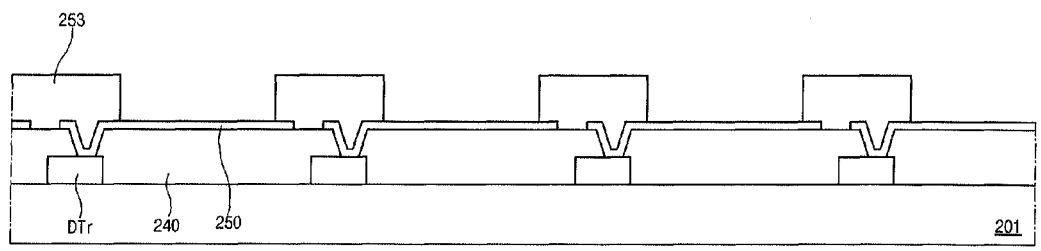
FIGS. 3A to 3L are cross-sectional views illustrating a method of fabricating an organic electroluminescent display according to a second embodiment of the present invention.
Figure 3B:
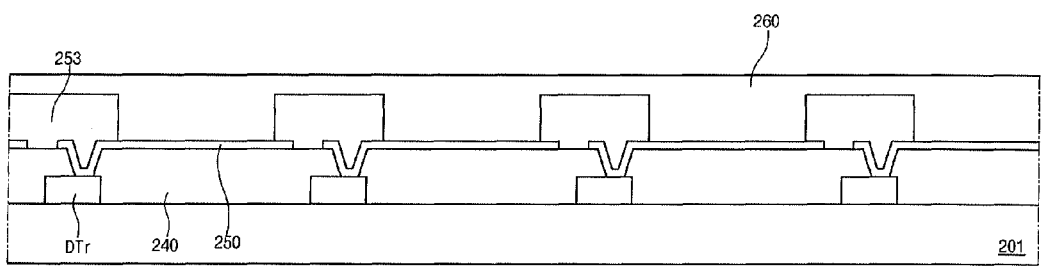

Referring to FIGS. 3A and 3B, a plastic material in liquid state is coated and thermally treated on the substrate 101, or a plastic material film is laminated on the substrate 101, to form a plastic layer 260. It is preferred that the first plastic layer 160 has a thickness of about 1 um to about 100 um.

The plastic material in liquid state may include at least one of PET (polyethylene terephthalate), TAC (triacetylcellulose), PC (polycarbonate), PMMA (polymethylmethacrylate), PES (polyether sulfone), PI(polyimide), COC (cyclic olefin copolymer) and acrylic group material.

Figure 3C:
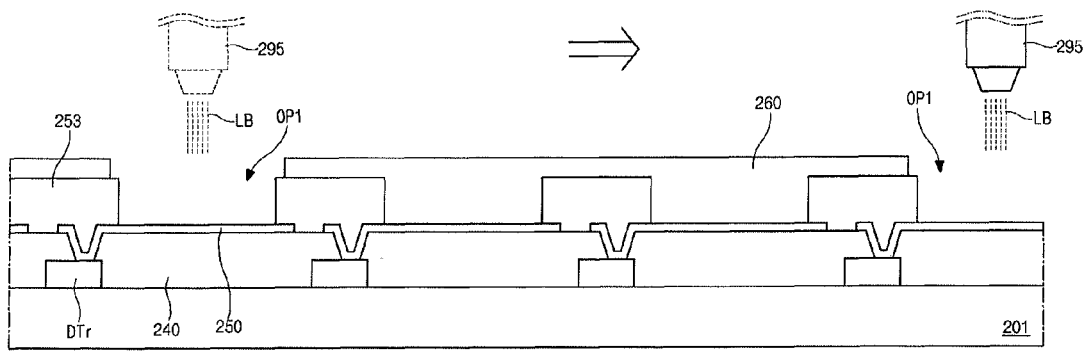

Then, referring to FIG. 3C, a laser beam LB having a predetermined energy density is radiated by a laser apparatus 295 for a portion of the plastic layer 260, at where an organic light emitting layer emitting a red light is formed, to selectively burn and remove the plastic layer 260.

Accordingly, a first opening OP 1 is formed at the region where the laser beam LB is radiated.

Figure 3D:
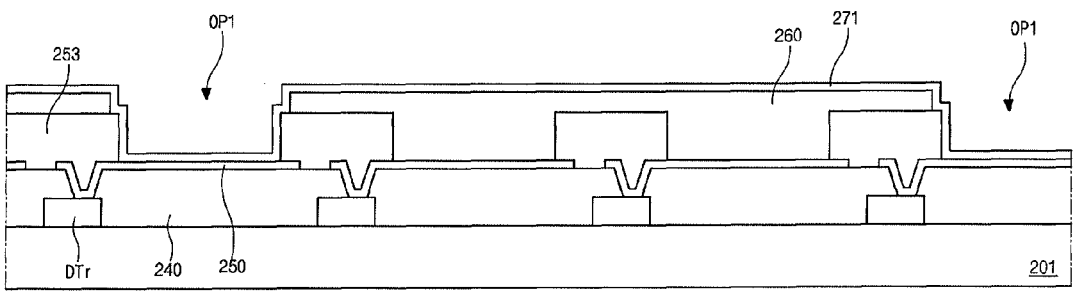

Then, referring to FIG. 3D, a red organic light emitting material is thermally deposited in a vacuum entirely on the plastic layer 260 having the first opening OP1, without a shadow mask, to form a red organic light emitting layer 271.

Figure 3E:
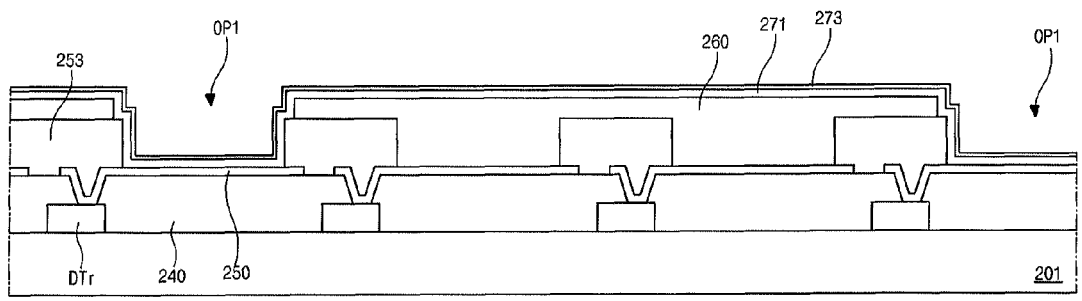

Then, referring to FIG. 3E, a first auxiliary layer 273 may be formed entirely on the red organic light emitting layer 271. The first auxiliary layer 273 is used to protect the red organic light emitting layer 271 and prevent permeation of moisture or oxygen. The first auxiliary layer 273 may be made of an inorganic insulating material, for example, silicon oxide ($SiO_2$) or silicon nitride (SiNx), or an organic insulating material.

Figure 3F:
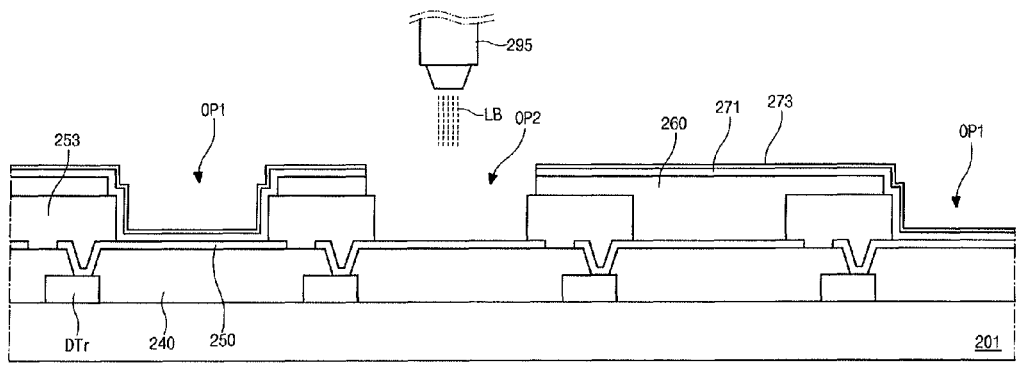

Then, referring to FIG. 3F, a laser beam LB having a predetermined energy density is radiated by a laser apparatus 295 over the first auxiliary layer 273 for a portion corresponding to a pixel region emitting a green light, to sequentially burn and remove the first auxiliary layer 273, the red organic light emitting layer and the plastic layer 260. Accordingly, a second opening OP2 exposing the first electrode 250 is formed.

Figure 3G:
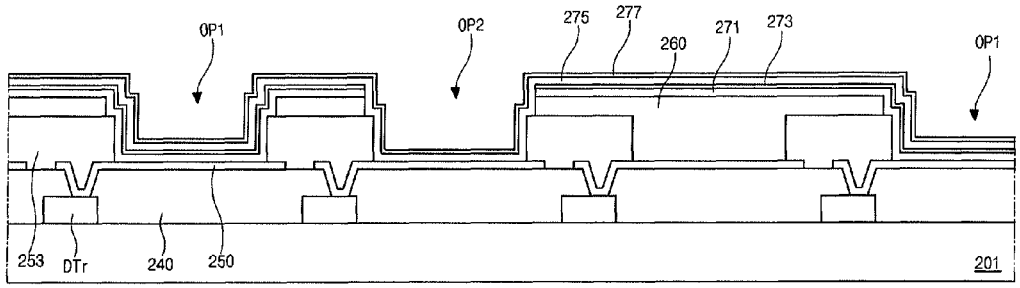

Then, referring to FIG. 3G, a green organic light emitting material is thermally deposited in a vacuum entirely on the first auxiliary layer 273, without a shadow mask, to form a green organic light emitting layer 275. Then, a second auxiliary layer 277 may be formed entirely on the green organic light emitting layer 275.

Figure 3H:
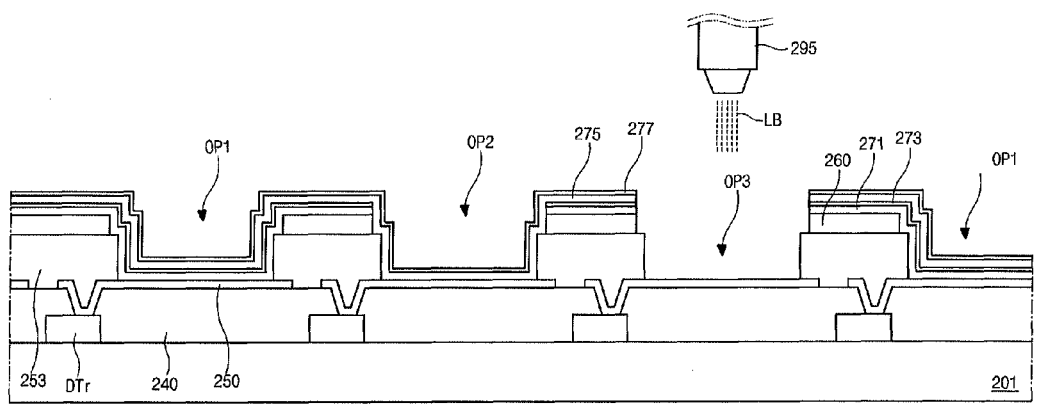

Then, referring to FIG. 3H, a laser beam LB having a predetermined energy density is radiated by a laser apparatus 295 over the second auxiliary layer 277 for a portion corresponding to a pixel region emitting a blue light, to sequentially burn and remove the second auxiliary layer 277, the green organic light emitting layer 275, the first auxiliary layer 273, the red organic light emitting layer and the plastic layer 260. Accordingly, a third opening OP3 exposing the first electrode 250 is formed.

Figure 3I:
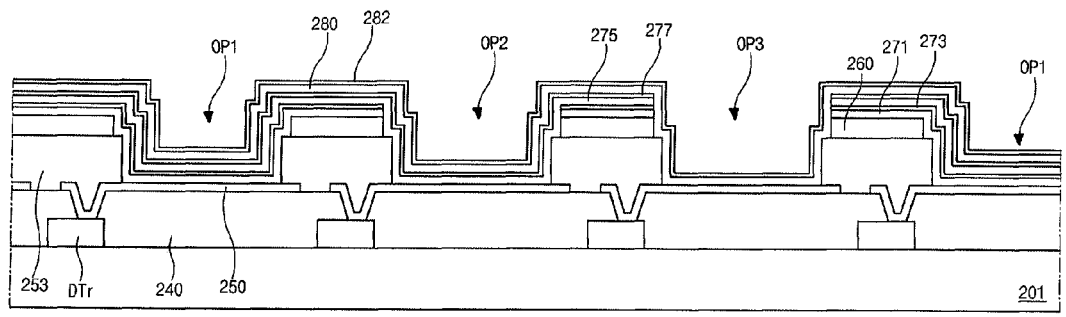

Then, referring to FIG. 3I, a blue organic light emitting material is thermally deposited in a vacuum entirely on the second auxiliary layer 277, without a shadow mask, to form a blue organic light emitting layer 280. Then, a third auxiliary layer 282 may be formed entirely on the blue organic light emitting layer 280.

Figure 3J:
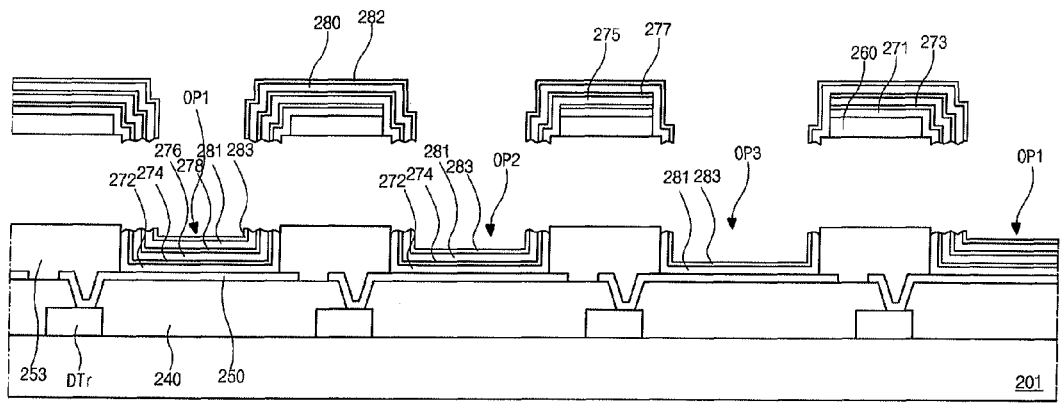
Figure 3K:
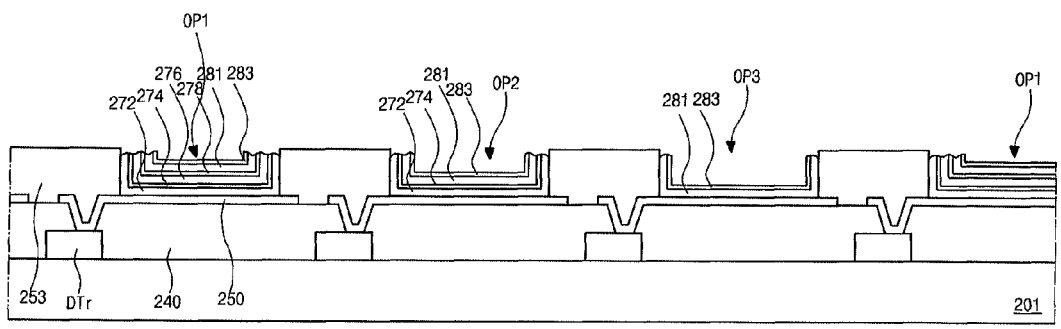

Then, referring to FIGS. 3J and 3K, the plastic layer 260 is removed from the substrate 201. Accordingly, the red organic light emitting layer 271, the first auxiliary layer 273, the green organic light emitting layer 275, the second auxiliary layer 277, the blue organic light emitting layer 280, and the third auxiliary layer 282 on the plastic layer 260 are also removed while red, green and blue organic light emitting layers 271, 275 and 280 and first to third auxiliary layers 273, 277 and 282 remains at the corresponding openings OP1 to OP3.

Accordingly, in the first opening OP1, a red organic light emitting pattern 272, a first auxiliary pattern 274, a green organic light emitting pattern 276, a second auxiliary pattern 278, a blue organic light emitting pattern 281, and a third auxiliary pattern 283 are formed on the first electrode 250.

In the second opening OP2, the green organic light emitting pattern 276, the second auxiliary pattern 278, the blue organic light emitting pattern 281, and the third auxiliary pattern 283 are formed on the first electrode 250.

In the third opening OP3, the blue organic light emitting pattern 281, and the third auxiliary pattern 283 are formed on the first electrode 250.

Figure 3L:
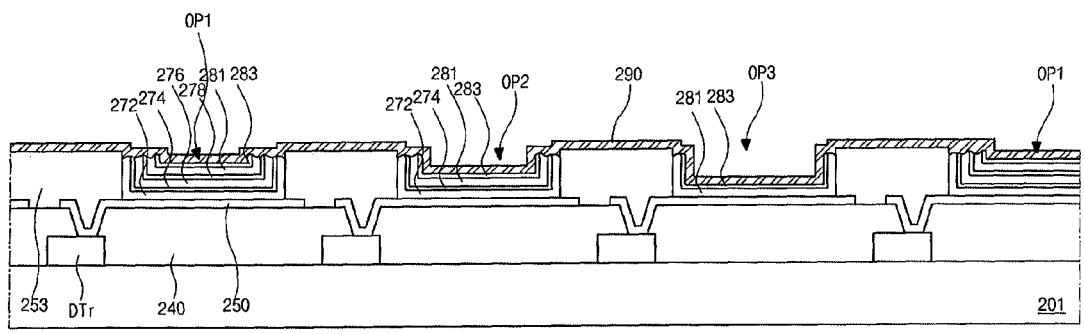

Then, referring to FIG. 3L, a second pixel electrode 290 is formed entirely on the third auxiliary pattern 283. Accordingly, an array substrate for an organic electroluminescent display is fabricated. The array substrate is attached to an opposing substrate or film to fabricate the organic electroluminescent display.

As described above, one plastic layer is formed without the related art shadow mask and is patterned in the laser radiation or the mask process having high precision in patterning to form the first to third openings, and the red, green and blue organic light emitting layers are formed corresponding to the first to third openings, and the plastic layer is removed to form the red, green and blue organic light patterns. Accordingly, technical effects similar to those of the first embodiment can be achieved.

Moreover, in the second embodiment, one plastic layer is formed and one process of removing the plastic layer is performed. Therefore, process time and production efficiency can be improved compared to the first embodiment using three plastic layers.

In the second embodiment, the first opening OP 1 is filled with the red, green and blue organic light emitting patterns 272, 276 and 281, the second opening OP2 is filled with the green and blue organic light emitting patterns 276 and 281, and the third opening OP3 is filled with the blue organic light emitting pattern 281. In this configuration, it looks as if a mixed color of red, green and blue i.e., a white light is emitted from the first opening OP1, and a mixed color of green and blue is emitted from the second opening OP2.

However, even though at least two of red, green and blue organic light emitting patterns 272, 276 and 281 are formed in the same opening, by appropriately adjusting material properties and thicknesses of the organic light emitting patterns, one color can be emitted from the opening. Accordingly, the first opening OP1 can be configured to emit the red light and the second opening OP2 can be configured to emit the green light.

FIGS. 4A to 4J are cross-sectional views illustrating a method of fabricating an organic electroluminescent display according to a third embodiment of the present invention. For the purposes of explanation, processes before forming an organic light emitting layer are omitted, and parts similar to those of the first or second embodiment may be omitted.

Figure 4A:
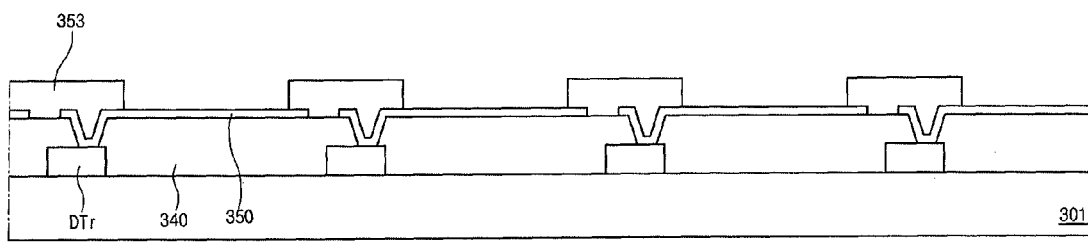
FIGS. 4A to 4J are cross-sectional views illustrating a method of fabricating an organic electroluminescent display according to a second embodiment of the present invention.
Figure 4B:
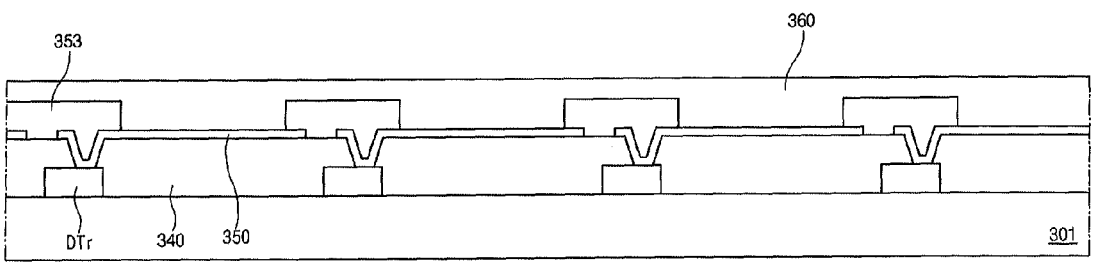
Figure 4C:
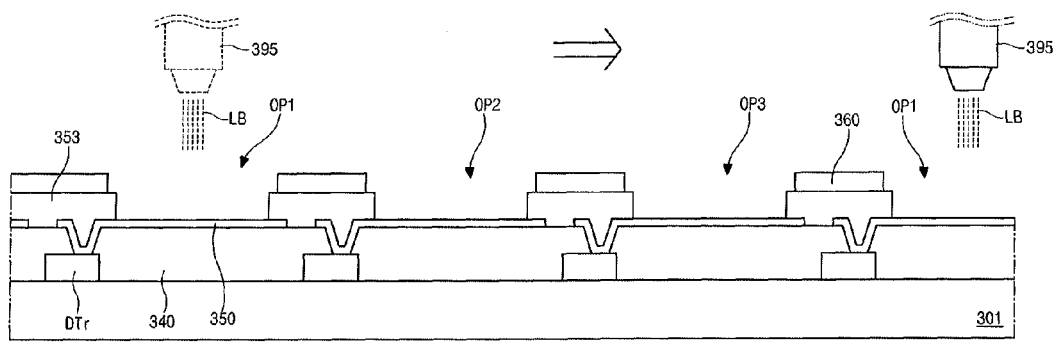

Referring to FIGS. 4A to 4C, a plastic material in liquid state is coated and thermally treated on the substrate 101, or a plastic material film is laminated on the substrate 301, to form a plastic layer 360. It is preferred that the first plastic layer 360 has a thickness of about 1 um to about 100 um.

Then, a radiation of a laser beam LB using a laser apparatus 395 or a mask process is performed for the plastic layer 360 to form first to third openings OP1 to OP3 exposing the first electrodes 350 in the respective pixel regions.

Figure 4D:
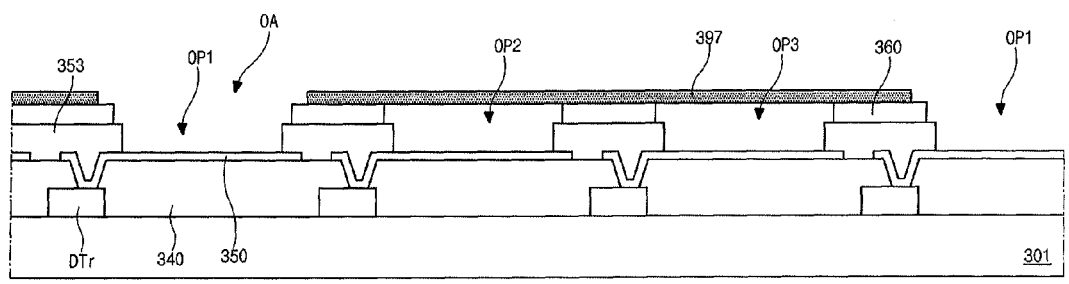
Figure 4E:
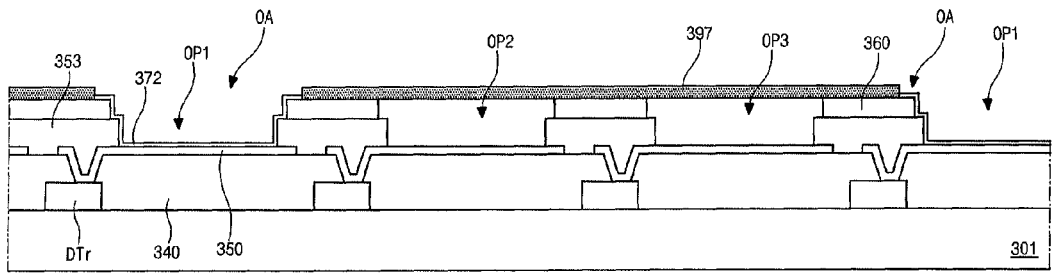

Then, referring to FIGS. 4D and 4E, a shadow mask 397 is placed on the substrate 301 such that an opening portion OA of the shadow mask 397 corresponds to the first opening OP1 and the shadow mask 397 shields other openings OP2 and OP3. In this state, a red organic light emitting material is thermally deposited in a vacuum to form a red organic light emitting pattern 372 in the first opening OP1.

Figure 4F:
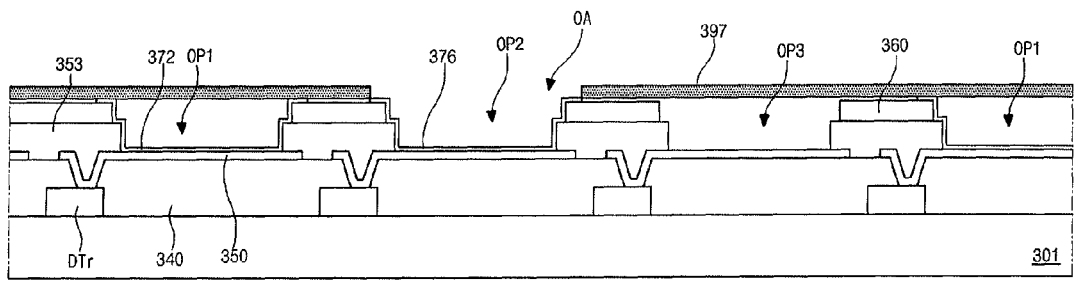
Figure 4G:
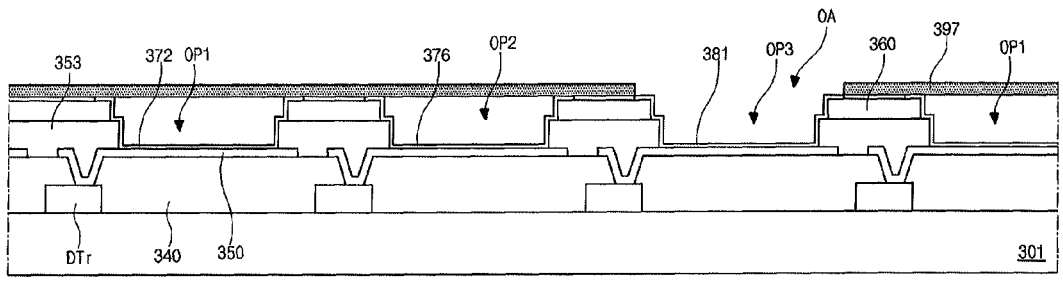
Figure 4H:
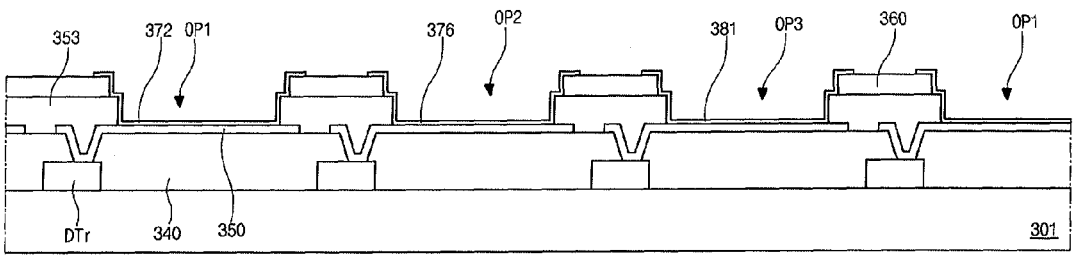

Then, referring to FIGS. 4F to 4H, the shadow mask 397 may be sequentially replaced with other ones which have opening portions OA corresponding to the second and third openings OP2 and OP3, respectively, and, using such the replaced shadow masks, green and blue organic light emitting materials may be thermally deposited in a vacuum to form green and blue organic light emitting patterns 376 and 381 in the second and third openings OP2 and OP3, respectively. Alternatively, in the state that the opening portion OA of the shadow mask 397 sequentially corresponds to the second and third openings OP2 and OP3, respectively, green and blue organic light emitting materials may be thermally deposited in a vacuum to form green and blue organic light emitting patterns 376 and 381 in the second and third openings OP2 and OP3, respectively.

Since the formations of the red, green and blue organic light emitting patterns 372, 376 and 381 uses the shadow mask 397, sagging of the shadow mask 397 and color spreading due to shadow effect may occur. However, post-process can solve such the problems.

Figure 4I:
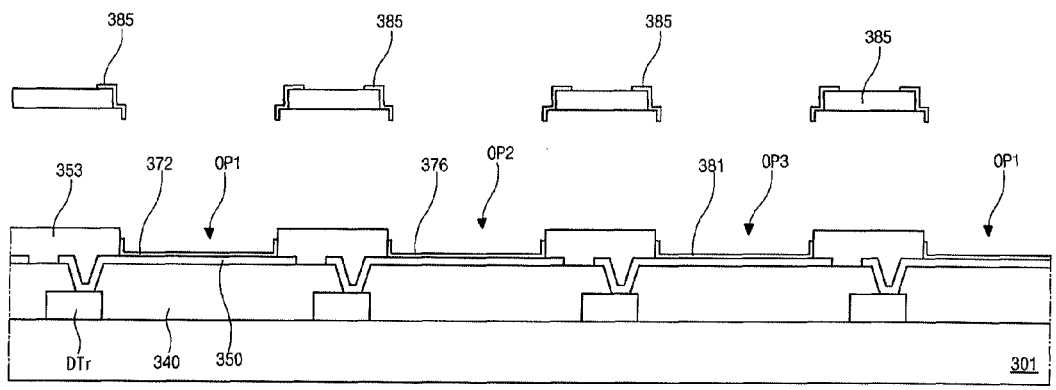

After forming the red, green and blue organic light emitting patterns 372, 376 and 381, referring to FIG. 4I, the plastic layer 360 is removed from the substrate 301 using a laser release method or de-lamination method.

Accordingly, the red, green and blue organic light emitting patterns 372, 376 and 381 on the plastic layer 360 are also removed, and thus the red, green and blue emitting patterns 372, 376 and 381 remain in the first to third openings OP1 to OP3, respectively.

In this case, even though the organic light emitting patterns 372, 376 and 381 spread outside the openings OA1 to OA3 because of the sagging of the shadow mask 397 and/or shadow effect, the organic light emitting patterns 372, 376 and 381 located at sides of the openings OA1 to OA3 are removed along with the plastic layer 360 as if lift-off process is performed. Accordingly, location error of the red, green and blue organic light emitting patterns 372, 376 and 381 and color spreading due to using the shadow mask 397 can be prevented.

Figure 4J:
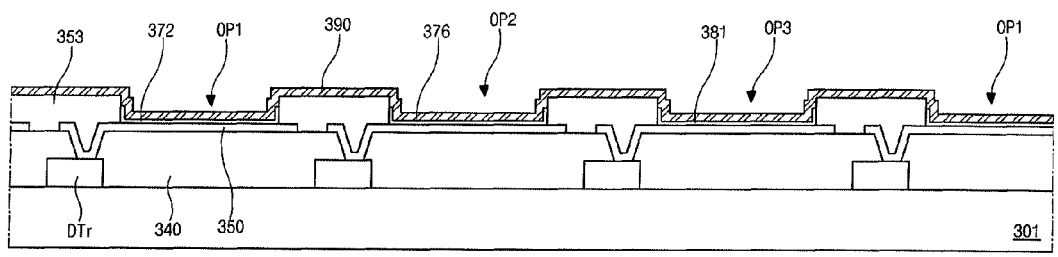

Then, referring to FIG. 4J, a second pixel electrode 390 is formed entirely on the substrate 301 having the red, green and blue organic light emitting patterns 372, 376 and 381. Accordingly, an array substrate for an organic electroluminescent display is fabricated. The array substrate is attached to an opposing substrate or film to fabricate the organic electroluminescent display.

In the above first to third embodiments, it is explained that the red, green and blue organic light emitting patterns are formed at the array substrate having the switching thin film transistor, the driving thin film transistor and the first electrode. However, an organic electroluminescent display, where the thin film transistors and the organic light emitting patterns are formed at different substrates, may be used that may is referred to as a dual panel type organic electroluminescent display. In this case, the organic light emitting patterns may be formed using the plastic layer on a transparent substrate or on a first electrode on a transparent substrate which faces the array substrate.

In the above embodiments, the laser radiation or mask process is performed for the plastic layer to form the openings, the organic light emitting layers are formed, and the plastic layer is removed along with the organic light emitting layer thereon. Therefore, high location precision for the organic light emitting layer can be achieved, and high resolution and high quality can be obtained.

Moreover, regarding formation of the bank, a width thereof (usually 12 um or more) enough to correct location error of the organic light emitting patterns, which is caused due to sagging of the shadow mask, size error of the opening portion of the shadow mask, aligning error of the shadow mask, shadow effect and the like, is not required, but error of patterning and location error in moving the laser radiation apparatus is considered. Accordingly, the width of the bank can be about 10% to about 60% of that of the related art. Therefore, since the width of the bank is less than that of the related art, aperture ratio can be improved, or size of pixel region can be reduced, thus PPI can increase and thus resolution can increase.

Moreover, even though the substrate has a large size of 10 inches or more, since the shadow mask is not employed, or even with the photo mask, the organic light emitting patterns are patterned by removing the plastic layer, error due to the shadow mask can be reduced. Therefore, large-sized substrate can be effectively treated.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:

1. A method of fabricating an organic electroluminescent display, the method comprising:
   forming a plastic layer on a substrate including a first pixel region, and second and third pixel regions;
   patterning the first plastic layer to form a first opening in the first pixel region;
   forming a first organic light emitting layer on the first plastic layer having the first opening; and
   removing the first plastic layer from the substrate to form a first organic light emitting pattern in the first opening,
   forming a second plastic layer on the first organic light emitting pattern;
   patterning the second plastic layer to form a second opening in the second pixel region;
   forming a second organic light emitting layer on the second plastic layer having the second opening;
   removing the second plastic layer from the substrate to form a second organic light emitting pattern in the second opening;
   forming a third plastic layer on the second organic light emitting pattern;
   patterning the third plastic layer to form a third opening in the third pixel region;
   forming a third organic light emitting layer on the third plastic layer having the third opening;
   removing the third plastic layer from the substrate to form a third organic light emitting pattern in the third opening;
   forming a bank at boundary portions among the first to third pixel regions before forming the first plastic layer; and
   forming a first electrode in each of the first to third pixel regions before forming the bank.

2. The method according to claim 1, wherein patterning each of the first to third plastic layers to form each of the first to third openings includes radiating a laser beam to each of the first to third plastic layers to selectively burn and remove each of the first to third plastic layers, or performing a mask process for each of the first to third plastic layers.

3. The method according to claim 1, wherein each of the first to third plastic layers is made of at least one of PET (polyethylene terephthalate), TAC (triacetylcellulose), PC (polycarbonate), PMMA (polymethylmethacrylate), PES (polyether sulfone), PI(polyimide), COC (cyclic olefin copolymer) and acrylic group material, or a mixture of the at least one and a photosensitive material.

4. The method according to claim 1, wherein removing each of the first to third plastic layers from the substrate includes radiating a laser beam from the back of the substrate, or fixing an end of each of the first to third plastic layers to a jig and then de-laminating each of the first to third plastic layers.

5. The method according to claim 1, further comprising performing a surface treatment for a surface of the substrate contacting each of the first to third plastic layers before forming each of the first to third plastic layers.

6. The method according to claim 1, wherein each of the first to third plastic layers is formed by coating in liquid state and then and hardening the coated plastic material, or laminating a film.

7. The method according to claim 1, further comprising forming a first auxiliary layer on the first organic light emitting layer, forming a second auxiliary layer on the second organic light emitting layer, and forming a third auxiliary layer on the third organic light emitting layer,
   wherein first to third auxiliary patterns are formed on the first to third organic light emitting patterns, respectively.

8. The method according to claim 7, wherein the first to third auxiliary patterns are each made of silicon oxide or silicon nitride.

9. The method according to claim 1, wherein the first to third organic light emitting patterns are different ones among red, green and blue organic light emitting patterns.

* * * * *